(12) United States Patent
Park et al.

(10) Patent No.: US 11,711,950 B2
(45) Date of Patent: Jul. 25, 2023

(54) DISPLAY DEVICE WITH OVERLAPPED OPENINGS IN PIXEL-DEFINING AND VIA-INSULATING LAYERS

(71) Applicant: SAMSUNG DISPLAY CO., LTD., Yongin-si (KR)

(72) Inventors: Yong Seung Park, Gyeonggi-do (KR); Young Min Kim, Seoul (KR); Ja Woon Lee, Seoul (KR); Min Jun Jo, Cheonan-si (KR); Hae Ri Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 312 days.

(21) Appl. No.: 17/034,402

(22) Filed: Sep. 28, 2020

(65) Prior Publication Data
US 2021/0134911 A1 May 6, 2021

(30) Foreign Application Priority Data
Nov. 6, 2019 (KR) .......................... 10-2019-0140882

(51) Int. Cl.
| | |
|---|---|
| H10K 59/124 | (2023.01) |
| H10K 50/842 | (2023.01) |
| H10K 59/122 | (2023.01) |
| H10K 59/131 | (2023.01) |
| H10K 71/00 | (2023.01) |
| H10K 59/12 | (2023.01) |

(52) U.S. Cl.
CPC ....... *H10K 59/124* (2023.02); *H10K 50/8426* (2023.02); *H10K 59/122* (2023.02); *H10K 59/131* (2023.02); *H10K 71/00* (2023.02); *H10K 59/1201* (2023.02)

(58) Field of Classification Search
CPC ............ H01L 27/3258; H01L 27/3246; H01L 27/3276; H01L 51/5246; H01L 51/56; H01L 2227/323; H10K 59/124; H10K 59/131; H10K 59/122; H10K 59/1201; H10K 71/00; H10K 50/8246
See application file for complete search history.

(56) References Cited

U.S. PATENT DOCUMENTS

| | | | |
|---|---|---|---|
| 7,795,803 B2 | 9/2010 | Kim et al. | |
| 2011/0221334 A1* | 9/2011 | Kwon | H01L 27/3246 313/504 |
| 2017/0148856 A1* | 5/2017 | Choi | H01L 27/3258 |

(Continued)

*Primary Examiner* — Lex H Malsawma
(74) *Attorney, Agent, or Firm* — F. Chau & Associates, LLC (57) ABSTRACT

A display device includes: a base substrate including an opening area, an opening peripheral area, and a display area at least partially surrounding the opening peripheral area, wherein the opening peripheral area is a non-display area at least partially surrounding the opening area; a thin film transistor disposed on the base substrate in the display area; a via insulating layer disposed on the thin film transistor and having a first opening surrounding the opening area, wherein the first opening is in the opening peripheral area; a pixel defining layer disposed on the via insulating layer and having a first opening which overlaps the first opening of the via insulating layer; a transparent filler disposed on the base substrate in the opening area; and a sealing substrate disposed on the transparent filler.

14 Claims, 8 Drawing Sheets

(56) References Cited

U.S. PATENT DOCUMENTS

| | | | |
|---|---|---|---|
| 2018/0151834 A1* | 5/2018 | Kanaya | H01L 51/504 |
| 2018/0226612 A1* | 8/2018 | Choi | H01L 27/3276 |
| 2020/0136087 A1* | 4/2020 | Kim | H01L 27/3225 |
| 2020/0176520 A1* | 6/2020 | Kim | H01L 51/5253 |

* cited by examiner

DISPLAY DEVICE WITH OVERLAPPED OPENINGS IN PIXEL-DEFINING AND VIA-INSULATING LAYERS

CROSS-REFERENCE TO RELATED APPLICATION

This application claims priority under 35 USC § 119 to Korean Patent Application No. 10-2019-0140882 filed on Nov. 6, 2019 in the Korean Intellectual Property Office (KIPO), the disclosure of which is incorporated by reference herein in its entirety.

TECHNICAL FIELD

Exemplary embodiments of the present inventive concept relate generally to a display device and a method of manufacturing the display device. More particularly, exemplary embodiments of the present inventive concept relate to a display device including an opening area in a display area and a method of manufacturing the display device.

DISCUSSION OF THE RELATED ART

Generally, display products are becoming smaller in size and lighter in weight, and are being developed to have superior performance. Conventional cathode ray tube (CRT) televisions have been widely used for display devices due to their performance and relatively low price. Recently, however, a display device, such as a plasma display device, a liquid crystal display device, and an organic light emitting diode display device, that overcomes weak points of the CRT in terms of miniaturization or portability and provides increased miniaturization, light weight, and low power consumption has been under development.

In an attempt to enlarge a display area of the display device, a bezel-less display device, a display device including a notch, and the like are under development, and a display device, in which an opening area or a hole is formed in a display area to position a camera or the like in the hole, and the like are under development.

SUMMARY

According to an exemplary embodiment of the present inventive concept, a display device includes: a base substrate including an opening area, an opening peripheral area, and a display area at least partially surrounding the opening peripheral area, wherein the opening peripheral area is a non-display area at least partially surrounding the opening area; a thin film transistor disposed on the base substrate in the display area; a via insulating layer disposed on the thin film transistor and having a first opening surrounding the opening area, wherein the first opening is in the opening peripheral area; a pixel defining layer disposed on the via insulating layer and having a first opening which overlaps the first opening of the via insulating layer; a transparent filler disposed on the base substrate in the opening area; and a sealing substrate disposed on the transparent filler.

In an exemplary embodiment of the present inventive concept, the transparent filler is disposed between the base substrate and the sealing substrate, and contacts the base substrate and the sealing substrate.

In an exemplary embodiment of the present inventive concept, the transparent filler includes an organic material, and the via insulating layer and the pixel defining layer each include an organic material.

In an exemplary embodiment of the present inventive concept, the base substrate and the sealing substrate each include glass, and the transparent filler has a refractive index of about 1.48.

In an exemplary embodiment of the present inventive concept, the display device further includes: a data signal line disposed between the base substrate and the via insulating layer, wherein the first opening of the via insulating layer and the first opening of the pixel defining layer expose the data signal line.

In an exemplary embodiment of the present inventive concept, the display device further includes: a first insulating layer disposed on the base substrate; a gate signal line disposed on the first insulating layer; and a second insulating layer disposed on the gate signal line, wherein the second insulating layer is disposed between the data signal line and the gate signal line.

In an exemplary embodiment of the present inventive concept, the first insulating layer, the second insulating layer, the via insulating layer, and the pixel defining layer are not disposed in the opening area.

In an exemplary embodiment of the present inventive concept, the transparent filler makes contact with the via insulating layer.

In an exemplary embodiment of the present inventive concept, the first opening of the via insulating layer and the first opening of the pixel defining layer form a first overlapping opening, wherein the via insulating layer includes a second opening, and the pixel defining layer includes a second opening overlapping the second opening of the via insulating layer, wherein the second opening of the via insulating layer and the second opening of the pixel defining layer form a second overlapping opening, wherein the first overlapping opening is spaced apart from the second overlapping opening.

In an exemplary embodiment of the present inventive concept, the first opening of the via insulating layer and the first opening of the pixel defining layer form a first overlapping opening, wherein a width of the first overlapping opening is between about 6 micrometers and about 10 micrometers.

In an exemplary embodiment of the present inventive concept, the display device further includes: an optical module disposed under the base substrate and overlapping the transparent filler in the opening area.

In an exemplary embodiment of the present inventive concept, the transparent filler, the sealing substrate, and the base substrate have a same refractive index.

In an exemplary embodiment of the present inventive concept, the display device further includes: a spacer disposed between the pixel defining layer and the sealing substrate.

In an exemplary embodiment of the present inventive concept, the display device further includes: a first electrode disposed on the via insulating layer and electrically connected to the thin film transistor; a light emitting layer disposed on the first electrode; and a second electrode disposed on the light emitting layer.

According to an exemplary embodiment of the present inventive concept, a method of manufacturing a display device includes: forming a thin film transistor in a display area of a base substrate including an opening area through which light passes, an opening peripheral area, and the display area at least partially surrounding the opening peripheral area, wherein the opening peripheral area is a non-display area at least partially surrounding the opening area; forming a via insulating layer in the opening peripheral area of the base substrate on which the thin film transistor is formed, wherein the via insulating layer includes an opening surrounding the opening area; providing a transparent filler in the opening area of the base substrate; and providing a sealing substrate on the transparent filler.

In an exemplary embodiment of the present inventive concept, the method further includes: forming a pixel defining layer on the via insulating layer, wherein the pixel defining layer includes an opening overlapping the opening of the via insulating layer.

In an exemplary embodiment of the present inventive concept, the transparent filler includes an organic material and a curing agent, and the via insulating layer and the pixel defining layer each include an organic material, and wherein the method further includes curing the transparent filler.

In an exemplary embodiment of the present inventive concept, a UV curing scheme, a hot-air or heat-plate curing scheme is used when the transparent filler is cured.

In an exemplary embodiment of the present inventive concept, the base substrate and the sealing substrate include glass, and the transparent filler has a refractive index of about 1.48.

In an exemplary embodiment of the present inventive concept, the method further includes: disposing an optical module under the base substrate to overlap the transparent filler; and forming a data signal line on the base substrate before the via insulating layer is formed, wherein the opening of the via insulating layer exposes the data signal line.

DETAILED DESCRIPTION OF THE EMBODIMENTS

Hereinafter, exemplary embodiments of the present inventive concept will be explained in detail with reference to the accompanying drawings.

Figure 1:
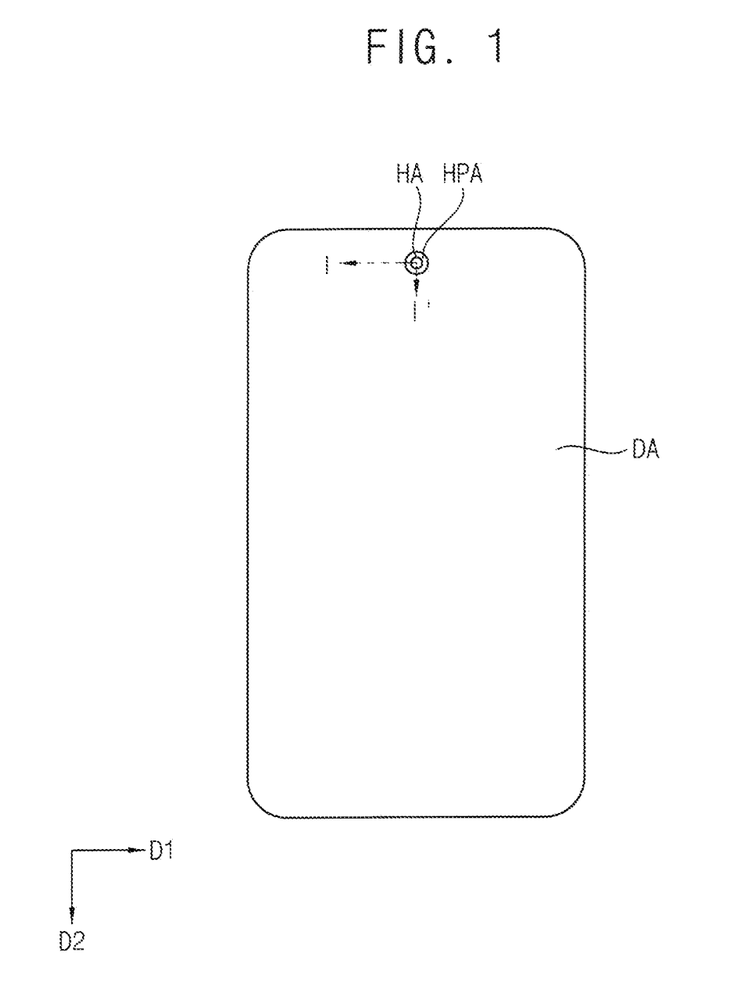
FIG. 1 is a plan view showing a display device according to an exemplary embodiment of the present inventive concept.

FIG. 1 is a plan view showing a display device according to an exemplary embodiment of the present inventive concept.

Referring to FIG. 1, a display device may include a display area DA, an opening peripheral area HPA located within the display area DA, and an opening area HA located within the opening peripheral area HPA.

The opening area HA may allow light to pass therethrough, and an optical module (see, e.g., 400 of FIG. 2) may overlap the opening area HA. The opening peripheral area HPA is a non-display area surrounding the opening area HA, and a signal line and the like may be disposed in the opening peripheral area HPA.

The display area DA is an area in which an image is displayed, and a plurality of pixels may be disposed in the display area DA. Each of the pixels may include a light emitting structure and a pixel circuit including and a thin film transistor electrically connected to the light emitting structure. For example, the display area DA may have a rectangular shape having a side elongated in a second direction D2 on a plane provided by a first direction D1 and the second direction D2 substantially perpendicular to the first direction D1. For example, the display area DA may have rounded corners.

A peripheral area, which is a non-display area where an image is not displayed, may be formed along an edge of the display device. For example, the peripheral area may at least partially surround the display area DA.

Figure 2:
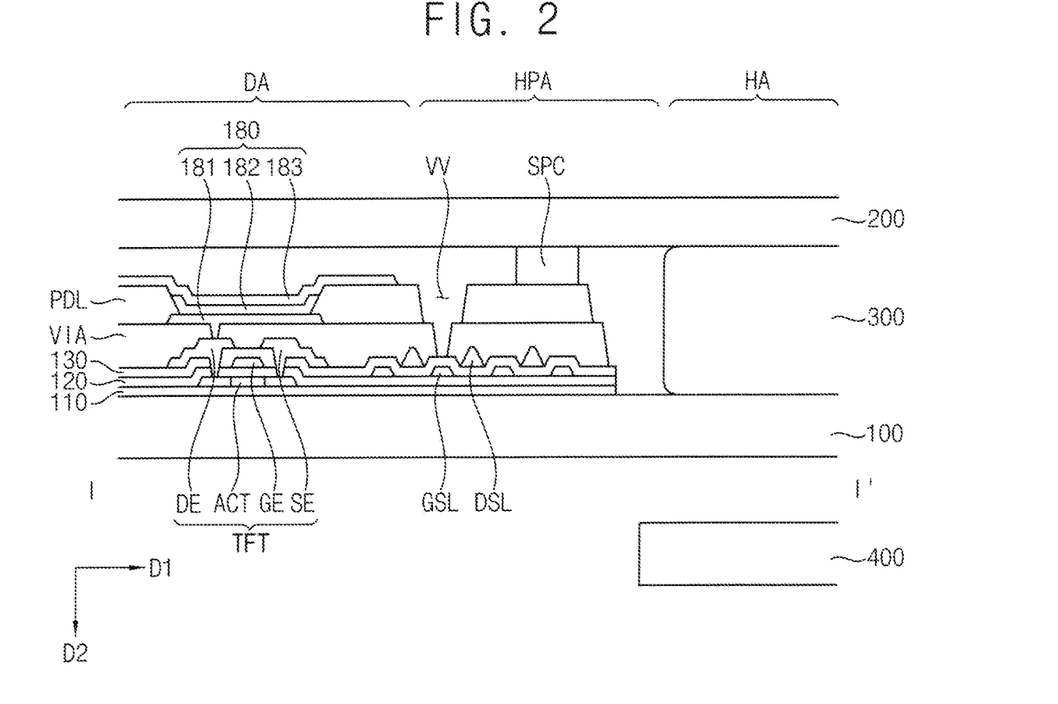
FIG. 2 is a sectional view showing the display device of FIG. 1 taken along line I-I'.

FIG. 2 is a sectional view showing the display device of FIG. 1 taken along line I-I'.

Referring to FIG. 2, the display device may include a base substrate 100, a buffer layer 110, an active pattern ACT, a first insulating layer 120, a gate conductive layer, a second insulating layer 130, a source-drain conductive layer, a via insulating layer VIA, a pixel defining layer PDL, a light emitting structure 180, a spacer SPC, a transparent filler 300, a sealing substrate 200, and an optical module 400.

The base substrate 100 may be formed of a transparent or opaque material. For example, the base substrate 100 may include a quartz substrate, a synthetic quartz substrate, a calcium fluoride substrate, a fluorine-doped quartz substrate (e.g., F-doped quartz substrate), a soda lime glass substrate, a non-alkali glass substrate, and the like. In an exemplary embodiment of the present inventive concept, the base substrate 100 may be a transparent resin substrate having flexibility. Examples of the transparent resin substrate that may be used as the base substrate 100 may include a polyimide substrate.

The buffer layer 110 may be disposed over the base substrate 100. The buffer layer 110 may prevent metal atoms or impurities from diffusing from the base substrate 100 into the active pattern ACT, and may control a heat transfer rate during a crystallization process for forming the active pattern ACT to obtain a substantially uniform active pattern ACT.

The buffer layer 110 may include an inorganic insulating material, and may not be formed in the opening area HA.

The active pattern ACT may be disposed on the buffer layer 110 in the display area DA. The active pattern ACT may include, for example, amorphous silicon or polycrystalline silicon. In an exemplary embodiment of the present inventive concept, the active pattern ACT may include an oxide. For example, the active pattern ACT may include at least one of indium (in), gallium (Ga), stannum (Sn), zirconium (Zr), vanadium (V), hafnium (Hf), cadmium (Cd), germanium (Ge), chromium (Cr), titanium (Ti), and/or zinc (Zn). The active pattern ACT may include a drain region, a source region, and a channel region disposed between the drain region and the source region. The drain region and the source region are doped with impurities.

The first insulating layer 120 may be disposed on the buffer layer 110. The first insulating layer 120 may be disposed along a profile of the active pattern ACT with a substantially uniform thickness to cover the active pattern ACT on the buffer layer 110. For example, the first insulating layer 120 may include a plurality of layers or a single layer. The first insulating layer 120 may include an inorganic insulating material, and may not be formed in the opening area HA.

The gate conductive layer may be disposed on the first insulating layer 120. The gate conductive layer may include a gate electrode GE and a gate signal line GSL. In addition, the gate electrode GE overlaps the active pattern ACT, and the gate signal line GSL is disposed in the opening peripheral area HPA. The gate conductive layer may be formed by using a metal, an alloy, metal nitride, conductive metal oxide, a transparent conductive material, and the like.

The second insulating layer 130 may be disposed on the first insulating layer 120 on which the gate conductive layer is disposed. The second insulating layer 130 may be disposed along a profile of the gate conductive layer with a substantially uniform thickness to cover the gate conductive layer on the first insulating layer 120. The second insulating layer 130 may include a plurality of layers or a single layer.

The second insulating layer 130 may include an inorganic insulating material, and may not be formed in the opening area HA.

The source-drain conductive layer may be disposed on the second insulating layer 130. The source-drain conductive layer may include a source electrode SE and a drain electrode DE, which are electrically connected to the source region and the drain region of the active pattern ACT, respectively, through contact holes formed through the second insulating layer 130 and the first insulating layer 120. The source-drain conductive layer may further include a data signal line DSL disposed in the opening peripheral area HPA. The source-drain conductive layer may be formed by using a metal, an alloy, metal nitride, conductive metal oxide, a transparent conductive material, and the like.

The gate electrode GE, the active pattern ACT, the source electrode SE, and the drain electrode DE may be included in the thin film transistor TFT.

The via insulating layer VIA may be disposed on the second insulating layer 130 on which the source-drain conductive layer is disposed. For example, the via insulating layer VIA may cover the source-drain conductive layer. The via insulating layer VIA may have a single-layer structure, and may also have a multilayer structure including, for example, at least two insulating films. The via insulating layer VIA may be formed by using an organic material such as a photoresist, an acryl-based resin, a polyimide-based resin, a polyamide-based resin, and a siloxane-based resin.

The light emitting structure 180 may include a first electrode 181, a light emitting layer 182, and a second electrode 183.

The first electrode 181 may be disposed on the via insulating layer VIA. The first electrode 181 may be electrically connected to the thin film transistor TFT through a via hole formed in the via insulating layer VIA. Depending on a light emitting scheme of the display device, the first electrode 181 may be formed of, for example, a reflective material or a transmissive material. For example, the first electrode 181 may include aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. These materials may be used alone or in combination with each other. In an exemplary embodiment of the present inventive concept, the first electrode 181 may have a single-layer structure or a multilayer structure including a metal film, an alloy film, a metal nitride film, a conductive metal oxide film, and/or a transparent conductive material film.

The pixel defining layer PDL may be disposed on the via insulating layer VIA on which the first electrode 181 is disposed. The pixel defining layer PDL may be formed of, for example, an organic material and the like. For example, the pixel defining layer PDL may be formed by using a photoresist, a polyacryl-based resin, a polyimide-based resin, an acryl-based resin, a silicone compound, and the like. According to an exemplary embodiment of the present inventive concept, the pixel defining layer PDL may be etched to form an opening which partially exposes the first electrode 181. The display area and the non-display area of the display device may be formed by the opening of the pixel defining layer PDL. For example, a portion in which the opening of the pixel defining layer PDL is located may correspond to the display area, and the non-display area may correspond to a portion adjacent to the opening of the pixel defining layer PDL.

The light emitting layer 182 may be disposed on the portion of the first electrode 181 exposed through the opening of the pixel defining layer PDL. In addition, the light emitting layer 182 may extend onto a side wall of the opening of the pixel defining layer PDL. In an exemplary embodiment of the present inventive concept, the light emitting layer 182 may have a multilayer structure including an organic light emitting layer, a hole injection layer, a hole transport layer, an electron transport layer, an electron injection layer, and the like. In an exemplary embodiment of the present inventive concept, except for the organic light emitting layer, the hole injection layer, the hole transport layer, the electron transport layer, the electron injection layer, and the like may be commonly formed to correspond to a plurality of pixels. The organic light emitting layer of the light emitting layer 182 may be formed by using light emitting materials for generating different color lights such as red light, green light, and blue light according to each pixel of the display device. According to an exemplary embodiment of the present inventive concept, the organic light emitting layer of the light emitting layer 182 may have a structure in which a plurality of light emitting materials for implementing different color lights such as red light, green light, and blue light are stacked to emit white light. In this case, the above light emitting structures may be commonly formed to correspond to the pixels, and the pixels may be classified by a color filter layer.

The second electrode 183 may be disposed on the pixel defining layer PDL and the light emitting layer 182. Depending on the light emitting scheme of the display device, the second electrode 183 may include, for example, a transmissive material or a reflective material. For example, the second electrode 183 may include aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. These materials may be used alone or in combination with each other. In an exemplary embodiment of the present inventive concept, the second electrode 183 may have a single-layer structure or a multilayer structure including a metal film, an alloy film, a metal nitride film, a conductive metal oxide film, and/or a transparent conductive material film.

In this case, an opening VV surrounding the opening area HA may be formed in the via insulating layer VIA and the pixel defining layer PDL. In addition, the opening VV may be provided in the opening peripheral area HPA. In an exemplary embodiment of the present inventive concept, the opening VV may not be in the display area DA.

For example, an opening surrounding the opening area HA that is surrounded by the opening peripheral area HPA may be formed in the via insulating layer VIA, and an opening which overlaps the opening of the via insulating layer VIA may be formed in the pixel defining layer PDL. Accordingly, the via insulating layer VIA and the pixel defining layer PDL, which include an organic material, may be isolated by the openings VV in a path extending between the opening area HA and the display area DA, so that a gas generated in a manufacturing process due to out-gassing from the transparent filler 300 or the like can be prevented from affecting the light emitting structure 180 in the display area DA by moving along a layer including an organic material. For example, a portion of pixel defining layer PDL and a portion of the via insulating layer VIA may be separated from another portion of the pixel defining layer PDL and another portion of the via insulating layer VIA by the openings VV.

In this case, the opening VV may have a predetermined width, so that the layer including the organic material may be cut. For example, a width of the opening VV at a top of the opening VV (e.g., a width of the opening VV at a top surface of the pixel defining layer PDL) may be between about 6 micrometers and about 10 micrometers.

The spacer SPC may be disposed on the pixel defining layer PDL to make contact with the sealing substrate 200. The spacer SPC may maintain a gap between the base substrate 100 and the sealing substrate 200. For example, the spacer SPC may be disposed in the opening peripheral area HPA.

The transparent filler 300 may be disposed between the base substrate 100 and the sealing substrate 200 in the opening area HA. The transparent filler 300 may fill in all spaces between the base substrate 100 and the sealing substrate 200 to prevent an air gap from being generated between the base substrate 100 and the sealing substrate 200 in the opening area HA. For example, the transparent filler 300 may make contact with the base substrate 100 and the sealing substrate 200.

The transparent filler 300 may have substantially the same refractive index as the sealing substrate 200 and the base substrate 100. For example, the transparent filler 300 may have a refractive index of about 1.48. The transparent filler 300 may include a transparent resin, and may include a thermal curing agent or a UV curing agent. The transparent filler 300 may be cured by using a UV curing scheme or a hot-air or heat-plate curing scheme. The transparent filler 300 may prevent the air gap from being generated between the sealing substrate 200 and the base substrate 100, and the transparent filler 300 has substantially the same refractive index as the sealing substrate 200 and the base substrate 100, so that a multiple reflection interference (MRI) phenomenon can be prevented from occurring in a process where light incident into or exiting from the optical module 400, which overlaps the opening area HA, passes through the sealing substrate 200, the transparent filler 300, and the base substrate 100. Accordingly, optical performance of the optical module 400 can be increased.

The sealing substrate 200 may be disposed on the spacer SPC and the transparent filler 300. The sealing substrate 200 may prevent moisture and oxygen from penetrating from an outside. The sealing substrate 200 may be formed of a transparent or opaque material. For example, the sealing substrate 200 may include a quartz substrate, a synthetic quartz substrate, a calcium fluoride substrate, a fluorine-doped quartz substrate (e.g., F-doped quartz substrate), a soda lime glass substrate, a non-alkali glass substrate, and the like. In an exemplary embodiment of the present inventive concept, the sealing substrate 200 may be a transparent resin substrate having flexibility. For example, a touch electrode and the like may be further provided on the sealing substrate 200.

The optical module 400 may be disposed under the base substrate 100 (e.g., in a third direction D3) to overlap the opening area HA. For example, the optical module 400 may include: a camera module for capturing (or, e.g., recognizing) an image of an object; a face recognition sensor module for detecting a face of a user; a pupil recognition sensor module for detecting a pupil of the user, an acceleration sensor module and a geomagnetic sensor module for determining a movement of the display device; a proximity sensor module and an infrared sensor module for detecting proximity with respect to a front side of the display device; and an illuminance sensor module for measuring a degree of brightness when left in a pocket or a bag.

Figure 3:
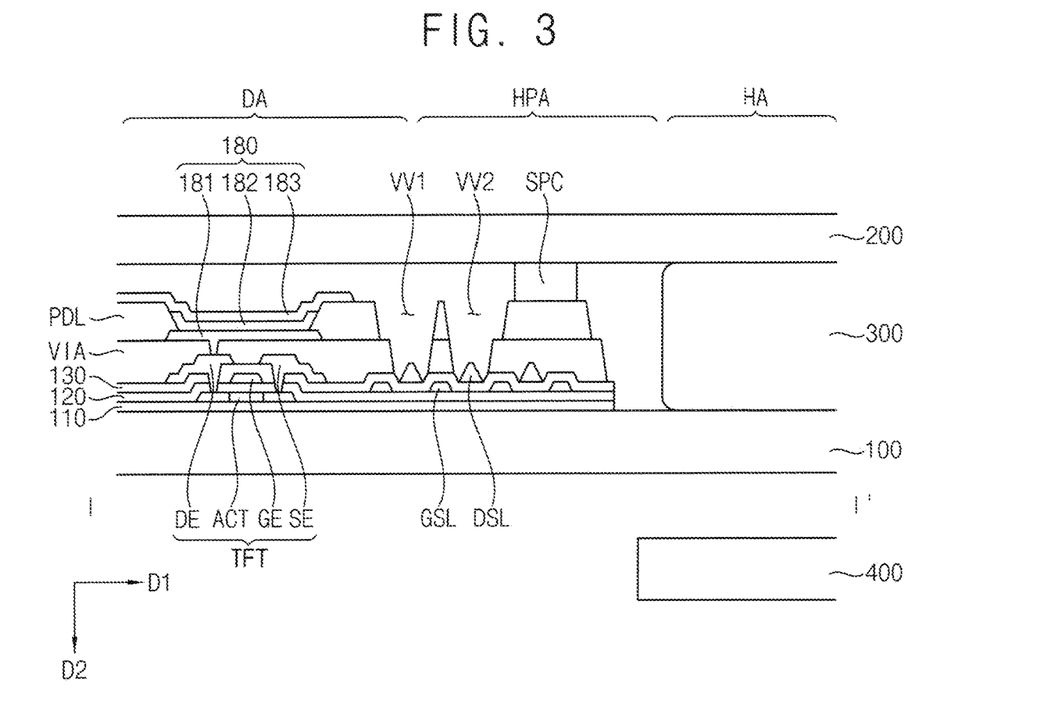
FIG. 3 is a sectional view showing a display device according to an exemplary embodiment of the present inventive concept.

FIG. 3 is a sectional view showing a display device according to an exemplary embodiment of the present inventive concept.

Referring to FIG. 3, a display device is substantially the same as the display device of FIGS. 1 and 2 except that the display device of FIG. 3 includes a first opening VV1 (e.g., a first overlapping opening) and a second opening VV2 (e.g., a second overlapping opening), and the first opening VV1 and the second opening VV2 expose a part of the source-drain conductive layer. Therefore, redundant descriptions thereof may be omitted.

The display device according to an exemplary embodiment of the present inventive concept may include a base substrate 100, a buffer layer 110, an active pattern ACT, a first insulating layer 120, a gate conductive layer, a second insulating layer 130, a source-drain conductive layer, a via insulating layer VIA, pixel a pixel defining layer PDL, a light emitting structure 180, a spacer SPC, a transparent filler 300, a sealing substrate 200, and an optical module 400.

The first opening VV1 and the second opening VV2 surrounding the opening area HA may be formed in the via insulating layer VIA and the pixel defining layer PDL. For example, the first and second openings VV1 and VV2 may extend along the opening peripheral area HPA.

The first opening VV may be spaced apart from the second opening VV2. The second opening VV2 may surround the opening area HA. The first opening VV1 may at least partially surround the second opening VV2.

For example, first and second openings surrounding the opening area HA may be formed in the via insulating layer VIA, and first and second openings which overlap the openings of the via insulating layer VIA may be formed in the pixel defining layer PDL. Accordingly, the via insulating layer VIA and the pixel defining layer PDL, which include an organic material, may be isolated by the second opening VV2 and the first opening VV1 in the path from the opening area HA to the display area DA, so that the gas generated in the manufacturing process due to the out-gassing from the transparent filler 300 or the like can be prevented from affecting the light emitting structure 180 in the display area DA by moving along a layer including an organic material. For example, a portion of pixel defining layer PDL and a portion of the via insulating layer VIA may be separated from another portion of the pixel defining layer PDL and another portion of the via insulating layer VIA by the first and second openings VV1 and VV2. In this case, a width of each of the first and second openings VV1 and VV2 may be between about 6 micrometers and about 10 micrometers.

In addition, the first and second openings VV1 and VV2 may expose the data signal line DSL which is a part of the source-drain conductive layer. In this case, the first and second openings VV1 and VV2 may be formed in a portion of the pixel defining layer PDL and via insulating layer VIA in which the data signal line DSL is disposed, so that a step difference can be reduced by a thickness of the data signal line DSL. For example, a step difference of the via insulating layer VIA may be reduced in the first and second openings of the via insulating layer VIA, so that a part of the pixel defining layer PDL may be prevented from remaining in the first and second openings VV1 and VV2 without being removed in a process of forming the pixel defining layer PDL, which is a subsequent process.

Figure 4:
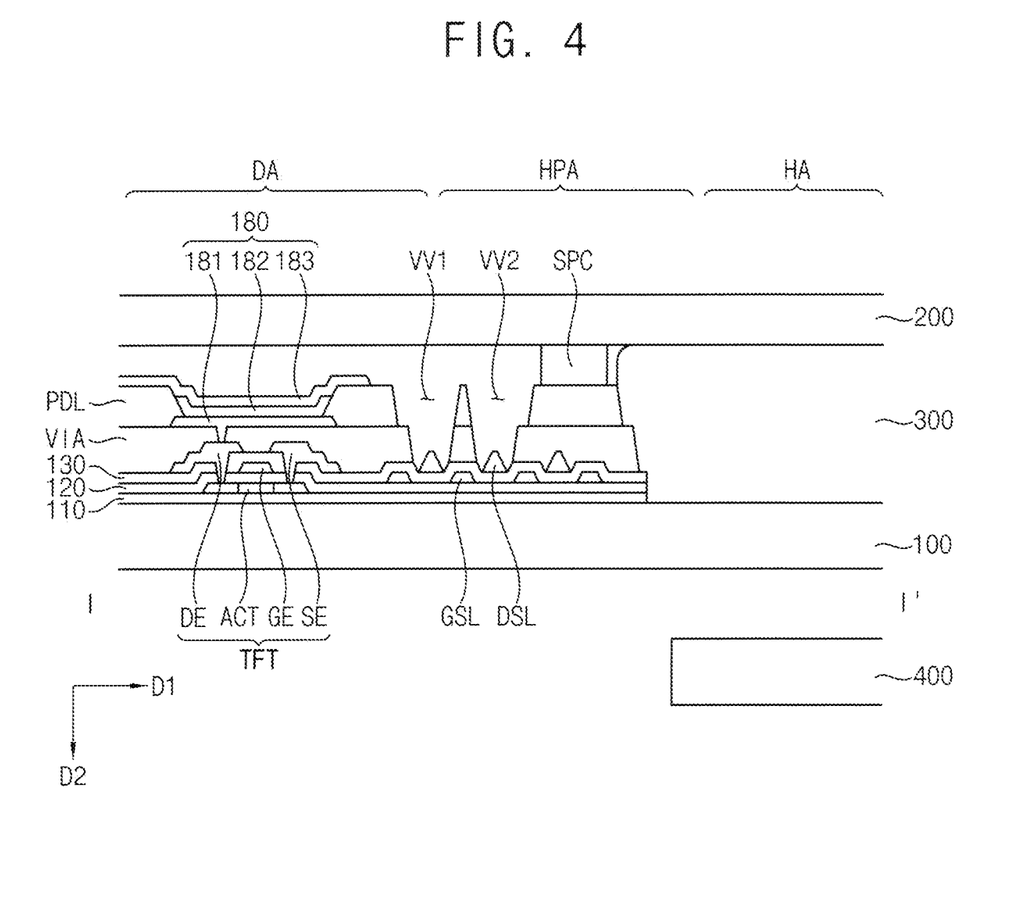
FIG. 4 is a sectional view showing a display device according to an exemplary embodiment of the present inventive concept.

FIG. 4 is a sectional view showing a display device according to an exemplary embodiment of the present inventive concept.

Referring to FIG. 4, a display device may be substantially the same as the display device of FIG. 3 except that the transparent filler 300 makes contact with the via insulating layer VIA and the pixel defining layer PDL.

The display device may include a base substrate 100, a buffer layer 110, an active pattern ACT, a first insulating layer 120, a gate conductive layer, a second insulating layer 130, a source-drain conductive layer, the via insulating layer VIA, pixel the pixel defining layer PDL, a light emitting structure 180, a spacer SPC, the transparent filler 300, a sealing substrate 200, and an optical module 400.

The transparent filler 300 may make contact with the via insulating layer VIA and the pixel defining layer PDL, which include an organic material. Even if the transparent filler 300 makes contact with the via insulating layer VIA and the pixel defining layer PDL, a path of the gas caused by the out-gassing is isolated by the openings VV and VV2 formed in the via insulating layer VIA and the pixel defining layer PDL (for details, see the description for FIG. 3), so that the gas generated in the manufacturing process due to the out-gassing from the transparent filler 300 or the like can be prevented from affecting the light emitting structure 180 in the display area DA by moving along a layer including an organic material.

FIGS. 5A to 5E are sectional views showing a method of manufacturing a display device according to an exemplary embodiment of the present inventive concept.

Figure 5A:
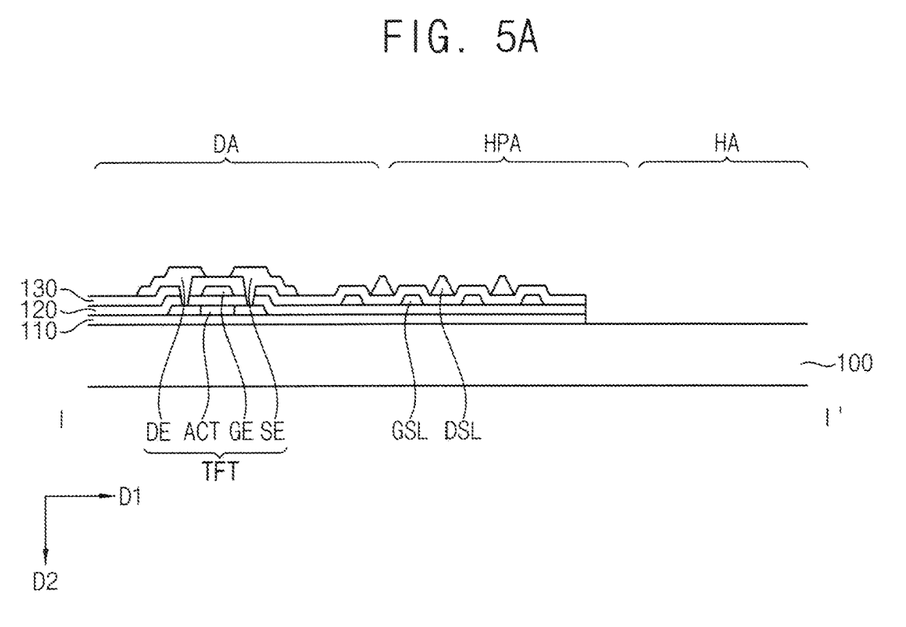
FIGS. 5A, 5B, 5C, 5D and 5E are sectional views showing a method of manufacturing a display device according to an exemplary embodiment of the present inventive concept.

Referring to FIG. 5A, the buffer layer 110, the active pattern ACT of the thin film transistor TFT, the first insulating layer 120, the gate conductive layer including the gate electrode GE of the thin film transistor TFT and the gate signal line GSL, the second insulating layer 130, and the source-drain conductive layer including the source and drain electrodes SE and DE of the thin film transistor TFT and the data signal line DSL may be formed on the base substrate 100. A part of the buffer layer 110, the first insulating layer 120, and the second insulating layer 130 may be removed in the opening area HA.

Figure 5B:
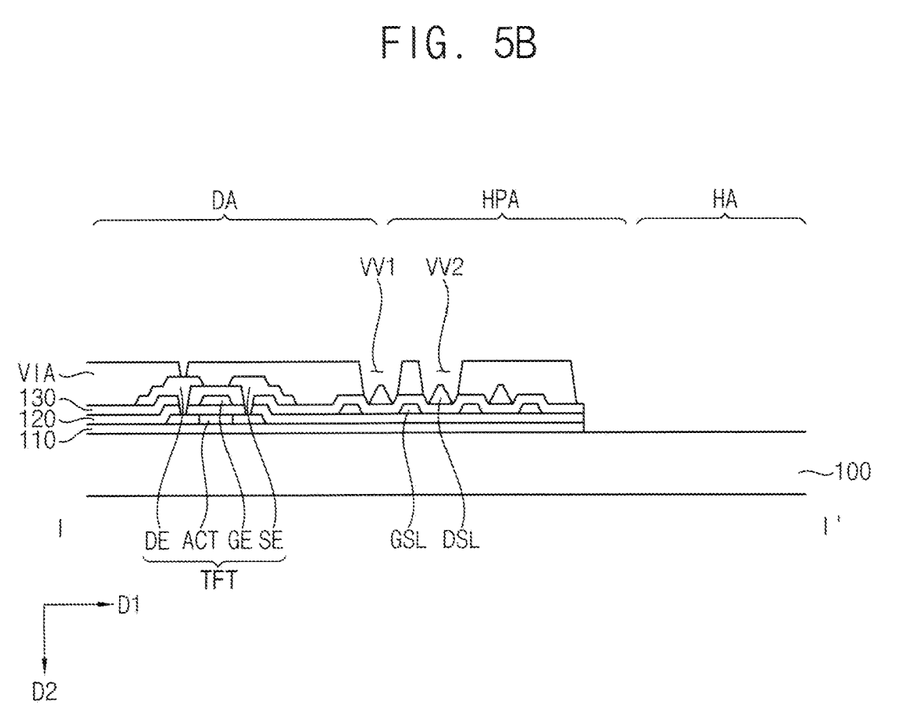

Referring to FIG. 5B, the via insulating layer VIA may be formed on the second insulating layer 130 on which the source-drain conductive layer is formed. For example, a photoresist material may be applied onto the second insulating layer 130, and may be exposed to light to be developed by using an additional mask, so that the via insulating layer VIA having the first opening VV1, the second opening VV2, and a via hole which exposes the drain electrode DE may be formed.

In this case, the first opening VV and the second opening VV2 may expose the data signal line DSL of the source-drain conductive layer.

Figure 5C:
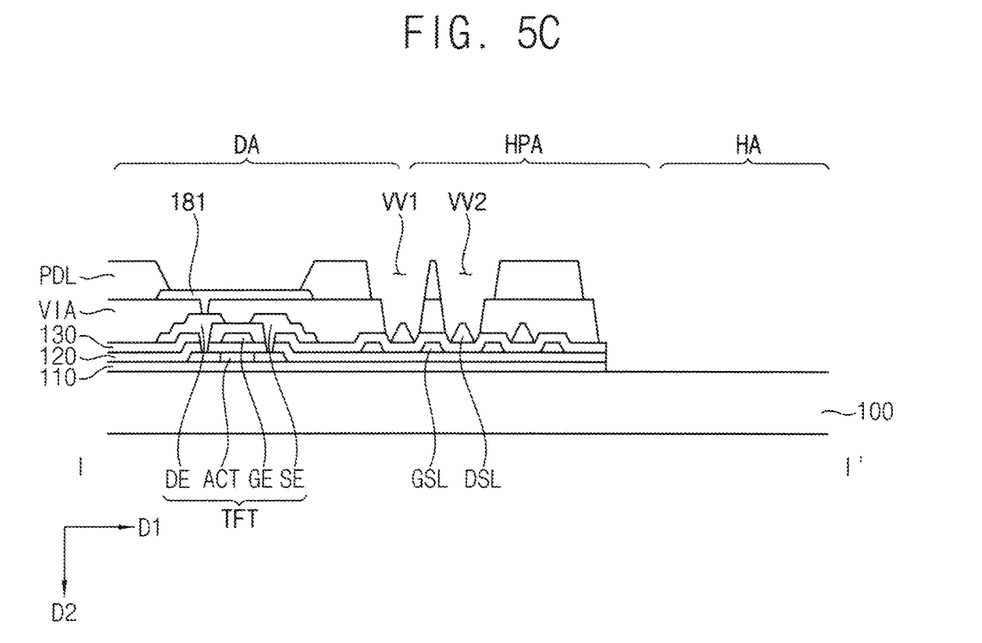

Referring to FIG. 5C, the first electrode 181 may be formed on the via insulating layer VIA. The pixel defining layer PDL may be formed on the via insulating layer VIA on which the first electrode 181 is formed. For example, a photoresist material may be applied onto the via insulating layer VIA, and may be exposed to light to be developed by using an additional mask, so that the pixel defining layer PDL having the first opening VV1, the second opening VV2, and an opening which exposes the first electrode 181 may be formed.

Figure 5D:
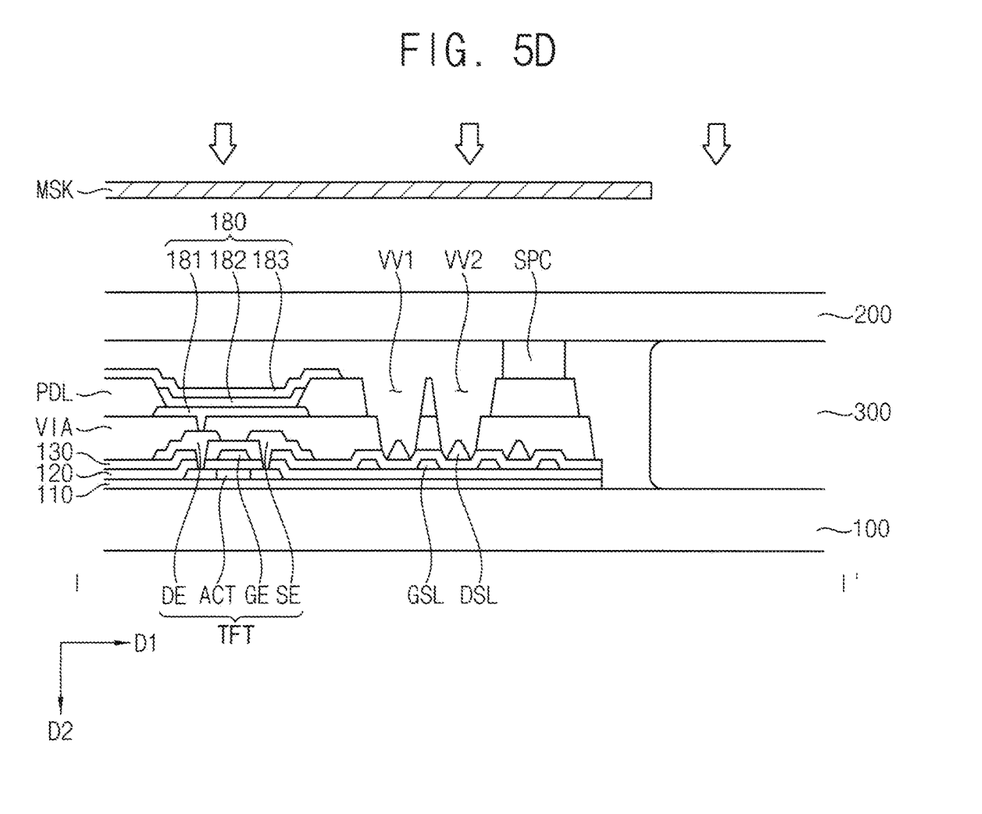

Referring to FIG. 5D, the light emitting layer 182 and the second electrode 183 may be formed on the first electrode 181. The spacer SPC may be formed on the pixel defining layer PDL. The transparent filler 300 may be formed on the base substrate 100 in the opening area HA. For example, the transparent filler 300 may include an uncured transparent resin solution, and may include a thermal curing agent or a UV curing agent. The sealing substrate 200 may be provided on the transparent filler 300 and the spacer SPC.

Thereafter, while the display area DA and the opening peripheral area HPA are covered with a mask MSK, the transparent filler 300 may be cured by providing heat or UV light to the transparent filler 300 in the opening area HA. In this case, the via insulating layer VIA and the pixel defining layer PDL, which include an organic material, may be isolated by the second opening VV2 and the first opening WI in the path from the opening area HA to the display area DA, so that a gas generated in a process of curing the transparent filler 300 due to the out-gassing can be prevented from affecting the light emitting structure 180 in the display area DA by moving along a layer including an organic material.

In addition, the gas caused by the out-gassing may be generated in the pixel defining layer PDL and the via insulating layer VIA at a portion of the opening peripheral area HPA adjacent to the opening area HA. In this case, the movement of the gas caused by the out-gassing may also be prevented by the first and second openings VV1 and VV2.

Figure 5E:
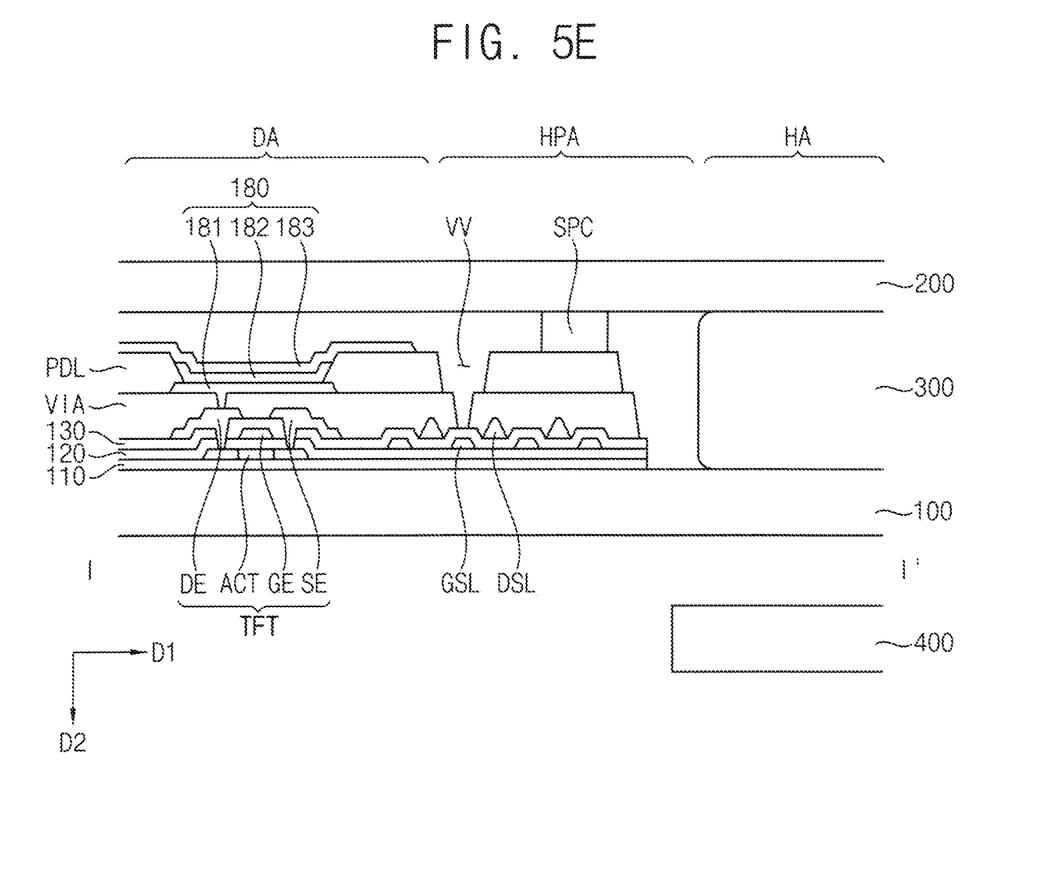

Referring to FIG. 5E, the optical module may be disposed to overlap the opening area HA, so that the display device can be manufactured. The transparent filler 300 of the display device may prevent the air gap from being generated between the sealing substrate 200 and the base substrate 100, and the transparent filler 300 has substantially the same refractive index as the sealing substrate 200 and the base substrate 100, so that the optical performance of the optical module 400 can be increased.

In addition, by forming the first and second openings VV1 and VV2, damage to the light emitting structure 180 resulting from the gas generated in the manufacturing process due to the out-gassing may be prevented.

Figure 6:
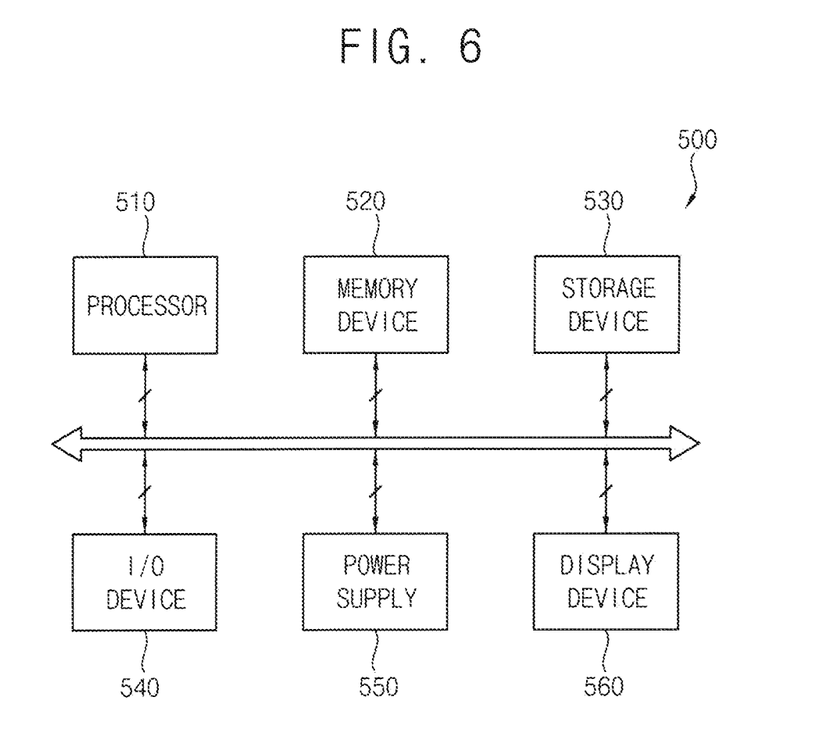
FIG. 6 is a block diagram illustrating an electronic device according to an exemplary embodiment of the present inventive concept.
Figure 7A:
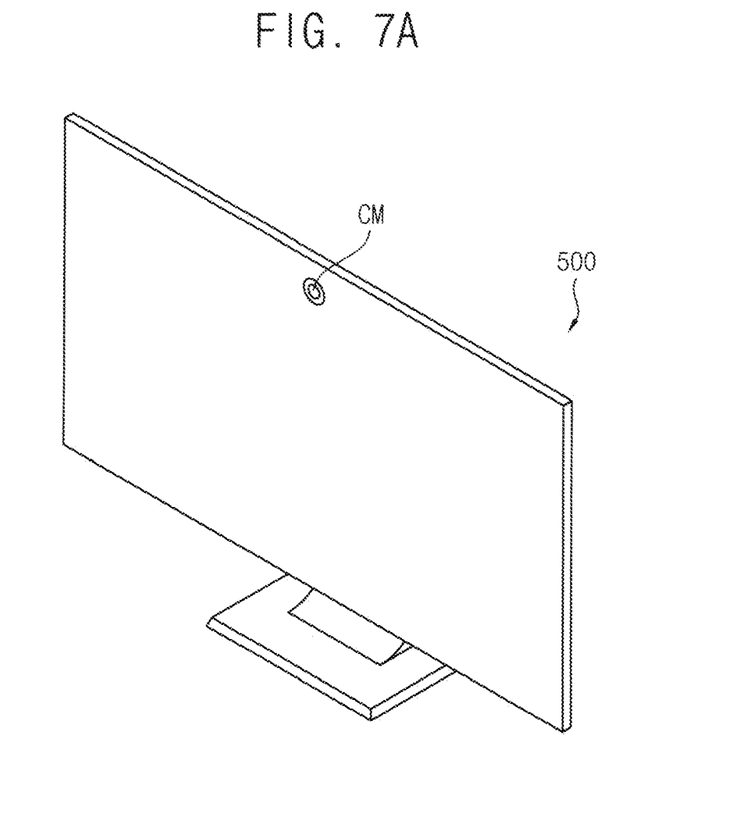
FIG. 7A is a diagram illustrating an example in which the electronic device of FIG. 6 is implemented as a television.
Figure 7B:
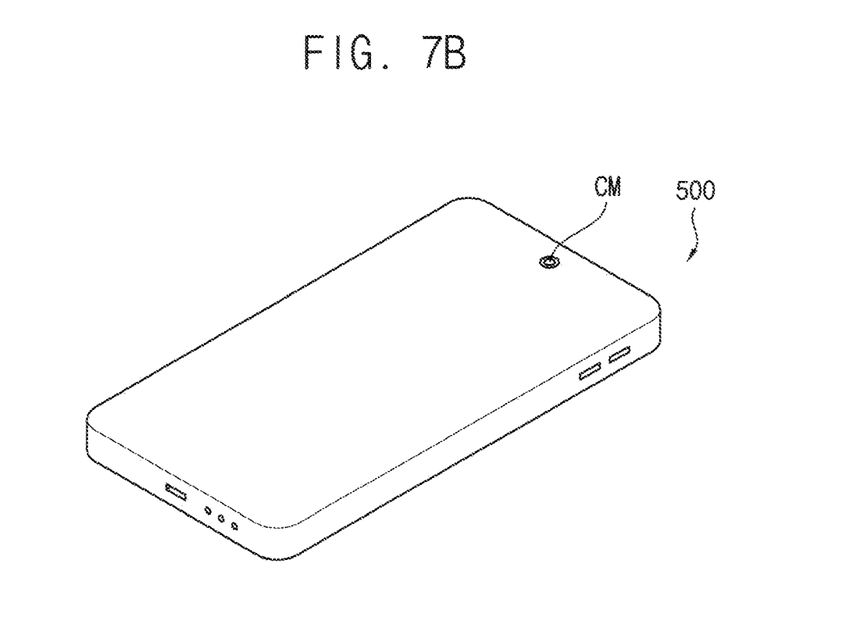
FIG. 7B is a diagram illustrating an example in which the electronic device of FIG. 6 is implemented as a smart phone.

FIG. 6 is a block diagram illustrating an electronic device according to an exemplary embodiment of the present inventive concept, FIG. 7A is a diagram illustrating an example in which the electronic device of FIG. 6 is implemented as a television, and FIG. 7B is a diagram illustrating an example in which the electronic device of FIG. 6 is implemented as a smart phone.

Referring to FIGS. 6 to 7B, the electronic device 500 may include a processor 510, a memory device 520, a storage device 530, an input/output (I/O) device 540, a power supply 550, and a display device 560. Here, the display device 560 may be the display device of FIG. 1. In addition, the electronic device 500 may further include a plurality of ports for communicating with a video card, a sound card, a memory card, a universal serial bus (USB) device, other electronic devices, etc. In an exemplary embodiment of the present inventive concept, as illustrated in FIG. 7A, the electronic device 500 may be implemented as a television. In an exemplary embodiment of the present inventive concept, as illustrated in FIG. 7B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) device, etc.

The processor 510 may perform various computing functions. For example, the processor 510 may be a microprocessor, a central processing unit (CPU), an application processor (AP), etc. The processor 510 may be coupled to other components of the electronic device 500 via an address bus, a control bus, a data bus, etc. Further, the processor 510 may be coupled to an extended bus such as a peripheral component interconnection (PC) bus. The memory device 520 may store data for operations of the electronic device 500. For example, the memory device 520 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device, such as a keyboard, a keypad, a mouse device, a touch-pad, a touch-screen, etc., and an output device such as a printer, a speaker, etc. The power supply 550 may provide power for operations of the electronic device 500.

The display device 560 may be coupled to other components via the buses or other communication links. In an exemplary embodiment of the present inventive concept, the I/O device 540 may include the display device 560. As described above, according to the display device 560, an opening area, in which an optical module CM such as a camera module is disposed, may be disposed in the display area. The display device 560 may include a base substrate, which includes an opening area through which light passes, an opening peripheral area which is a non-display area at least partially surrounding the opening area, and a display area at least partially surrounding the opening peripheral area, a thin film transistor disposed on the base substrate in the display area, a via insulating layer disposed on the thin film transistor and having an opening at least partially surrounding the opening area along the opening peripheral area, a pixel defining layer disposed on the via insulating layer and having an opening which overlaps the opening of the via insulating layer, a transparent filler disposed on the base substrate in the opening area, and a sealing substrate disposed on the transparent filler.

The transparent filler may have substantially the same refractive index as the sealing substrate and the base substrate, so that the MR phenomenon can be prevented from occurring in the process where the light incident into or exiting from the optical module, which overlaps the opening area, passes through the sealing substrate, the transparent filler, and the base substrate. Accordingly, the optical performance of the optical module can be increased.

In addition, the via insulating layer and the pixel defining layer, which include an organic material, may be isolated by the openings of the via insulating layer and the pixel defining layer in the path from the opening area to the display area, so that the gas generated in the manufacturing process due to the out-gassing from the filler or the like can be prevented from affecting the light emitting structure in the display area by moving along a layer including an organic material. Since these are described above, duplicated description related thereto may not be repeated.

The present inventive concept may be applied to a display device and an electronic device including the display device. For example, the present inventive concept may be applied to a smart phone, a cellular phone, a video phone, a smart pad, a smart watch, a tablet PC, a car navigation system, a television, a computer monitor, a laptop, a head mounted display device, etc.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display device comprising:
a base substrate including an opening area, an opening peripheral area, and a display area at least partially surrounding the opening peripheral area, wherein the opening peripheral area is a non-display area at least partially surrounding the opening area;
a thin film transistor disposed on the base substrate in the display area;
a via insulating layer disposed on the thin film transistor and having a first opening surrounding the opening area, wherein the first opening is in the opening peripheral area;
a pixel defining layer disposed on the via insulating layer and having a first opening which overlaps the first opening of the via insulating layer;
a transparent filler disposed on the base substrate in the opening area; and
a sealing substrate disposed on the transparent filler,
wherein the first opening of the pixel defining layer does not overlap the opening area.

2. The display device of claim 1, wherein the transparent filler is disposed between the base substrate and the sealing substrate, and contacts the base substrate and the sealing substrate.

3. The display device of claim 2, wherein the transparent filler includes an organic material, and the via insulating layer and the pixel defining layer each include an organic material.

4. The display device of claim 3, wherein the base substrate and the sealing substrate each include glass, and the transparent filler has a refractive index of about 1.48.

5. The display device of claim 1, further comprising:
a data signal line disposed between the base substrate and the via insulating layer,
wherein the first opening of the via insulating layer and the first opening of the pixel defining layer expose the data signal line.

6. The display device of claim 5, further comprising:
a first insulating layer disposed on the base substrate;
a gate signal line disposed on the first insulating layer; and
a second insulating layer disposed on the gate signal line,
wherein the second insulating layer is disposed between the data signal line and the gate signal line.

7. The display device of claim 6, wherein the first insulating layer, the second insulating layer, the via insulating layer, and the pixel defining layer are not disposed in the opening area.

8. The display device of claim 1, wherein the transparent filler makes contact with the via insulating layer.

9. The display device of claim 1, wherein the first opening of the via insulating layer and the first opening of the pixel defining layer form a first overlapping opening,
wherein the via insulating layer includes a second opening, and the pixel defining layer includes a second opening overlapping the second opening of the via insulating layer, wherein the second opening of the via insulating layer and the second opening of the pixel defining layer form a second overlapping opening,
wherein the first overlapping opening is spaced apart from the second overlapping opening.

10. The display device of claim 1, wherein the first opening of the via insulating layer and the first opening of the pixel defining layer form a first overlapping opening,
wherein a width of the first overlapping opening is between about 6 micrometers and about 10 micrometers.

11. The display device of claim 1, further comprising:
an optical module disposed under the base substrate and overlapping the transparent filler in the opening area.

12. The display device of claim 1, wherein the transparent filler, the sealing substrate, and the base substrate have a same refractive index.

13. The display device of claim 1, further comprising:
a spacer disposed between the pixel defining layer and the sealing substrate.

14. The display device of claim 1, further comprising:
a first electrode disposed on the via insulating layer and electrically connected to the thin film transistor;
a light emitting layer disposed on the first electrode; and
a second electrode disposed on the light emitting layer.

* * * * *